(12) United States Patent
Bemmerl et al.

(10) Patent No.: US 10,840,172 B2
(45) Date of Patent: Nov. 17, 2020

(54) LEADFRAME, SEMICONDUCTOR PACKAGE INCLUDING A LEADFRAME AND METHOD FOR FORMING A SEMICONDUCTOR PACKAGE

(71) Applicant: Infineon Technologies AG, Neubiberg (DE)

(72) Inventors: Thomas Bemmerl, Schwandorf (DE); Azlina Kassim, Melaka (MY); Nurfarena Othman, Melaka (MY)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/893,754

(22) Filed: Feb. 12, 2018

(65) Prior Publication Data
US 2018/0233438 A1    Aug. 16, 2018

(30) Foreign Application Priority Data
Feb. 14, 2017 (DE) .................. 10 2017 202 345

(51) Int. Cl.
   *H01L 23/495*     (2006.01)
   *H01L 21/48*      (2006.01)
   (Continued)

(52) U.S. Cl.
CPC .... *H01L 23/49568* (2013.01); *H01L 21/4825* (2013.01); *H01L 21/565* (2013.01); *H01L 23/3114* (2013.01); *H01L 23/4952* (2013.01); *H01L 23/49503* (2013.01); *H01L 23/49524* (2013.01); *H01L 23/49551* (2013.01); *H01L 23/49562* (2013.01); *H01L 23/49575* (2013.01); *H01L 23/3107* (2013.01); *H01L 2224/16245* (2013.01); *H01L 2224/40245* (2013.01); *H01L 2224/48137* (2013.01); *H01L 2224/48465* (2013.01); *H01L 2924/18161* (2013.01)

(58) Field of Classification Search
CPC ......... H01L 23/49568; H01L 23/49551; H01L 21/4825; H01L 21/565; H01L 23/3114; H01L 23/49503; H01L 23/4952; H01L 23/49524; H01L 23/49562; H01L 23/49575; H01L 23/3107; H01L 2924/181; H01L 21/561; H01L 23/3121; H01L 23/49537; H01L 23/49541
See application file for complete search history.

(56) References Cited

U.S. PATENT DOCUMENTS 7,145,224 B2 * 12/2006 Kawashima ...... H01L 23/49562
                                             257/678
9,431,327 B2 * 8/2016 Tsai .................. H01L 23/49503
(Continued)

FOREIGN PATENT DOCUMENTS

JP        06061408 A   *   3/1994

*Primary Examiner* — Benjamin Tzu-Hung Liu
(74) *Attorney, Agent, or Firm* — Viering, Jentschura & Partner MBB

(57) ABSTRACT

A leadframe, that is to be incorporated into a semiconductor housing is provided. The leadframe may include a first die pad, a second die pad and a plurality of contact pads. A lower surface of the contact pads and a lower surface of the first die pad are arranged in a first plane. An upper surface of the second die pad is arranged in a second plane distant from the first plane by an overall thickness of the semiconductor package.

15 Claims, 14 Drawing Sheets

(51) Int. Cl.
*H01L 21/56* (2006.01)
*H01L 23/31* (2006.01)

(56) References Cited

U.S. PATENT DOCUMENTS

| | | |
|---|---|---|
| 2005/0161785 A1 | 7/2005 | Kawashima et al. |
| 2007/0080437 A1* | 4/2007 | Marimuthu ........... H01L 21/561 |
| | | 257/676 |
| 2009/0294936 A1* | 12/2009 | Liu ................... H01L 23/49524 |
| | | 257/675 |
| 2015/0348889 A1 | 12/2015 | Tsai et al. |

\* cited by examiner

US 10,840,172 B2

LEADFRAME, SEMICONDUCTOR PACKAGE INCLUDING A LEADFRAME AND METHOD FOR FORMING A SEMICONDUCTOR PACKAGE

CROSS-REFERENCE TO RELATED APPLICATION

This application claims priority to German Patent Application Serial No. 10 2017 202 345.7, which was filed Feb. 14, 2017, and is incorporated herein by reference in its entirety.

TECHNICAL FIELD

The present disclosure relates to semiconductor packages, leadframes and methods for manufacturing semiconductor packages.

BACKGROUND

A semiconductor package houses an electronic component or more specifically a semiconductor die or a semiconductor chip. The semiconductor package protects the component from environmental influences.

A leadframe assures electrical connections between the electronic component or the semiconductor die or chip and the outside of the package. A leadframe generally includes a die pad and a plurality of contact pads. Electronic components, for example semiconductor dies and more specifically power semiconductor dies, may produce heat while functioning and may need to be cooled. Advantageously cooling of the semiconductor package may be effectuated from two sides of the package.

SUMMARY

In accordance with a first aspect of the disclosure a leadframe to be included in a semiconductor package includes a first die pad and at least a second die pad, a plurality of contact pads. A lower surface of the contact pads and a lower surface of the first die pad are arranged in a first plane. An upper surface of the second die pad is arranged in a second plane distant from the first plane by an overall thickness of the semiconductor package.

In accordance with a second aspect of the disclosure a semiconductor package includes a first die pad, a second die pad and a plurality of contact pads, a first die attached to an upper surface of the first die pad, and a mold compound covering the first die and defining an outer surface of the semiconductor package. A lower surface of the first die pad and an upper surface of the second die pad form part of the outer surface of the semiconductor package. A lower surface of the plurality of contact pads and the lower surface of the first die pad form a mounting surface.

In accordance with a third aspect of the disclosure a method of forming a semiconductor package is provided. The method includes providing a leadframe, the leadframe including a first die pad and a second die pad, a plurality of contact pads, wherein a lower surface of the contact pads and a lower surface of the first die pad are arranged on a first plane, and an upper surface of the second die pad is arranged on a second plane distant from the first plane by an overall thickness of the semiconductor package to be formed; attaching a first die on an upper surface of the first die pad; molding the semiconductor package in a mold tool to have the mold compound form a lower surface of the semiconductor package in the first plane and form an upper surface of the semiconductor package in the second plane.

In accordance with a fourth aspect of the disclosure a semiconductor package includes a leadframe structure including a die attach region and a plurality of leads, a mold compound disposed around at least a portion of the leadframe structure. The mold compound includes a first recess, and a first die disposed in the first recess.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1A:
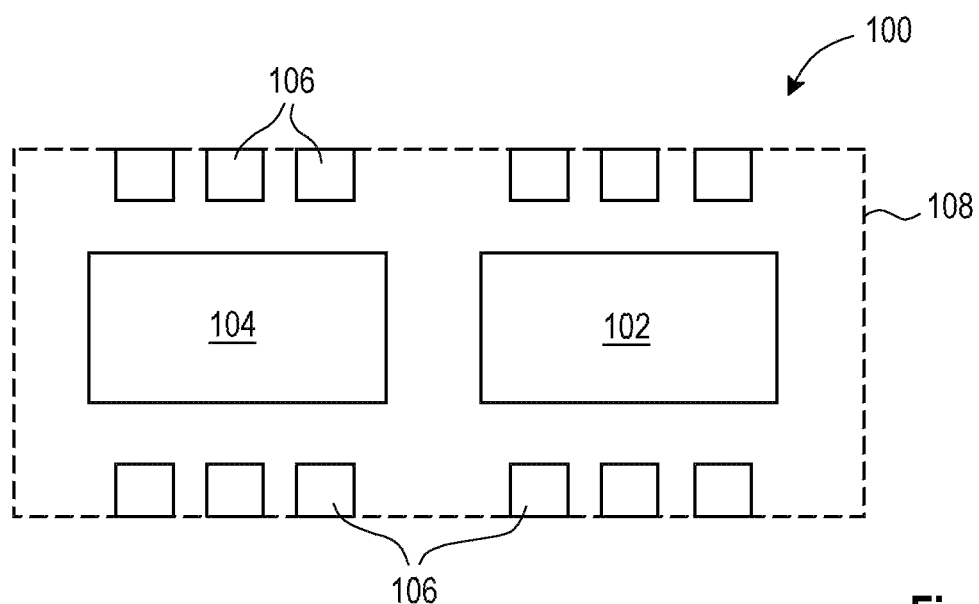
FIG. 1A schematically illustrates a plan view of a leadframe in accordance with the disclosure.

In the following, examples are described with reference to the drawings wherein like reference numerals are generally utilized to refer to like elements throughout. In the following description, for purposes of explanation, numerous specific details are set forth in order to provide a thorough understanding of one or more aspects of examples. However, it may be evident to a person skilled in the art that one or more aspects of the examples may be practiced with a lesser degree of these specific details. The following description is therefore not to be taken in a limiting sense, and the scope of protection is defined by the appended claims.

The various aspects summarized may be implemented in various forms. The following description shows by way of illustration various combinations and configurations in which the aspects may be practiced. It is understood that the described aspects are merely examples and that other aspects and/or examples may be utilized and structural and functional modifications may be made without departing from the scope of the present disclosure. In this regard, directional terminology, such as "top", "bottom", "front", "back", "leading", "trailing", etc., is used with reference to the orientation of the Figure(s) being described. Because components of examples can be positioned in a number of different orientations, the directional terminology is used for purposes of illustration and is in no way limiting. In addition, while a particular feature or aspect of an example may be disclosed with respect to only one of several implementations, such feature or aspect may be combined with one or more other features or aspects of the other implementations as it may be desired and advantageous for any given or particular application.

As employed in this specification, the terms "connected", "coupled", "electrically connected" and/or "electrically coupled" are not meant to necessarily mean that the elements must be directly connected or coupled together. Intervening elements may be provided between the "connected", "coupled", "electrically connected" or "electrically coupled" elements.

Semiconductor packages and methods for manufacturing semiconductor packages are described herein. Comments made in connection with a described semiconductor package may also hold true for a corresponding method and vice versa. For example, if a specific component of a semiconductor package is described, a corresponding method for manufacturing the semiconductor package may include an act of providing the component in a suitable manner, even if such an act is not explicitly described or illustrated in the figures. In addition, the features of the various exemplary aspects described herein may be combined with each other, unless specifically noted otherwise.

Leadframes in accordance with the disclosure may include die pads. A die pad may allow mounting of a die or a chip. Leadframes in accordance with the disclosure may include contact pads. Contact pads may be configured to extend out of a package for manufacturing of a leaded package. Contact pads may be configured not to extend out of a package for manufacturing of a leadless package. Leadframes in accordance with the disclosure may include bonding pads. Bonding pads may be configured to receive bonding wire connections for connecting electrical contacts of dies or chips to the leadframe.

A plurality of leadframes may be interconnected by a support frame. A support frame may include support bars which may connect die pads as well as contact pads to the support frame. It may be only after finishing the semiconductor package that the support bars may be cut and the package may be singulated. The support frame and the support bars may be removed at the end of the manufacturing process. The support frame and the support bars may be removed at least partly during the manufacturing process. Removing may create free standing die pads and separate contact pads.

Leadframes in accordance with the disclosure may include contact pads which are electrically connected to a die pad. In other words, one or more contact pads may be in one piece with a die pad. Contact pads may be different in size and form.

Leadframes in accordance with the disclosure may include more than one die pad. Die pads may be different in size and form. Die pads may be of a rectangular form. Die pads may have any other form than a rectangular form.

Leadframes in accordance with the disclosure may be formed out of a metal sheet. Leadframes in accordance with the disclosure may be single gauge leadframes with a same thickness of all elements. Leadframes may be formed out of a copper sheet or out of any other metal. Leadframes may include more than one metal. A suitable copper-iron alloy which may be used is C194 ESH (Extra Spring Hard). A suitable copper-nickel alloy which may be used is C7025.

All structures of leadframes in accordance with the disclosure may be produced in an etching process. All structures of leadframes in accordance with the disclosure may be produced in a stamping process. Of course, other methods of producing the structures may also be used, e.g. laser cutting. The leadframes in accordance with the disclosure may be plated. A plating process may be limited to the contact pads or to other portions which need to be solder to enhance solderability. Suitable materials to enhance solderability are gold, silver, platinum, zinc, tin, nickel, copper and alloys of these metals. A suitable alloy is for example nickel-palladium-silver/gold.

Leadframes in accordance with the disclosure may include die pads which are adapted to an attachment used for attaching a die. Die pads may be covered by a suitable material for facilitating or enabling the attachment, e.g. attachment by soldering or by gluing. Dies may be attached for example by attach materials such as conductive or non-conductive adhesive, Ag-sinter, conductive or non-conductive tape (cDAF-conductive die attach film, DDAF-dielectric die attach film).

Leadframes in accordance with the disclosure may be bent to include structures in different planes or different levels. The different planes may be parallel to each other. Leadframes in accordance with the disclosure may be formed from a single gauge leadframe with down-sets in opposite directions. Or in other words, the leadframes in accordance with the present disclosure may be bent-up and bent-down from a single metal sheet. More specifically parts of the leadframes may be bent-up and other parts of the same leadframe may be bent-down with reference to the support frame. The support frame may then be arranged in a plane in-between a plane defined by the bent-up portions and a plane defined by the bent-down portions. Leadframes in accordance with the disclosure may be bent up and down to include more than two different planes.

Semiconductor packages in accordance with the disclosure may include a die or chip and a mold compound. The die or chip may be formed of any semiconductor material as e.g. silicon (Si) or a III/V compound semiconductor material, e.g. gallium arsenide (GaAs). The die or chip may be formed of any other material. The die or chip may be a power semiconductor die. The die or chip may be MOS field effect transistor (MOSFET). The die or chip may have a vertical current flow.

Semiconductor packages in accordance with the disclosure may include a mold compound. The mold compound may cover the die or chip. The mold compound may define an outer surface of the semiconductor package.

The mold compound may be formed in a molding process. For example, the molding process may include transfer molding. Transfer molding may be regarded as a molding process in which components may be formed in a closed mold tool from a mold compound. The mold compound may be conveyed under pressure in a hot, plastic state from a transfer pot through tubes into closed cavities. The mold compound thus may encapsulate the die forming the semiconductor package. The encapsulant material or mold compound may e.g. be an insulating material. For example, the encapsulant material may include a dielectric material. In specific examples, the encapsulant material may include at least one of a polymer, a fiber impregnated polymer, a particle filled polymer, other organic materials, etc. The encapsulant may be made of any appropriate duroplastic, thermoplastic, thermosetting material, etc. The material of the encapsulant may include filler materials in some examples. The encapsulant may include epoxy material and filler material including small particles of glass or other electrically insulating mineral filler materials like alumina or organic filler material. A film-assisted mold process may be used.

Figure 1B:
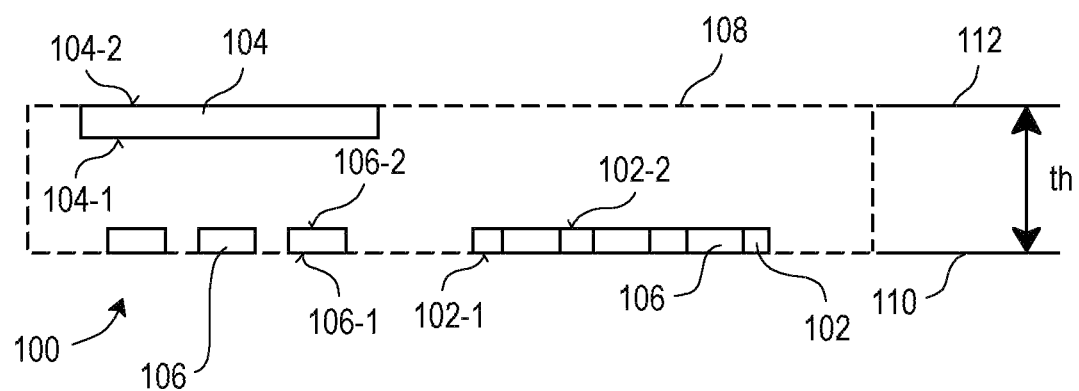
FIG. 1B schematically illustrates a side view of the leadframe of FIG. 1A.

FIG. 1A and FIG. 1B show schematically an exemplary leadframe 100 in accordance with the first or the second aspect of the disclosure. FIG. 1A shows the leadframe 100 in a top view and FIG. 1B shows the leadframe 100 in a side view. Leadframe 100 may include a first die pad 102 and a second die pad 104. Die pad 102 and die pad 104 may be of a rectangular shape and of equal dimensions. This is in no way limiting and the die pads 102 and 104 may be different in size and form and they may have any other form than a rectangular form. Die pad 102 includes a lower surface 102-1 and an upper surface 102-2. Die pad 104 includes a lower surface 104-1 and an upper surface 104-2. A distance between the lower surface 104-1 and the upper surface 104-2 defines a thickness of die pad 104. A distance between a lower surface 102-1 and an upper surface 102-2 of die pad 102 defines a thickness of die pad 102.

Leadframe 100 may further include a plurality of contact pads 106. In the example shown, the leadframe 100 includes twelve contact pads. This is in no way limiting and any number of contact pads is possible. In the example shown, the contact pads 106 are disposed in two lines on opposite sides of die pads 102 and 104. This kind of contact pad arrangement is known as dual in-line. The arrangement in two lines of the contact pads is in no way limiting and another placement of the contact pads is possible. Each of contact pads 106 includes a lower surface 106-1 and an upper surface 106-2. A distance between lower surface 106-1 and upper surface 106-2 defines a thickness of contact pads 106.

A dashed line 108 indicates a future outline of a semiconductor package in which leadframe 100 may be included. In FIG. 1A the contact pads 106 do not reach beyond the dashed line or in other words the contact pads 106 do not project over the outer circumference of the semiconductor package. FIG. 1A indicates with the dashed line 108 a so-called leadless package. This is in no way limiting as the present disclosure encompasses also leaded packages.

FIG. 1A and FIG. 1B show for ease of understanding a singulated leadframe 100 which is to be included in a semiconductor package. As known to the person skilled in the art and discussed above, during a process of forming a semiconductor package a plurality of leadframes is interconnected by a support frame which is not shown in FIG. 1A, FIG. 1B.

Leadframe 100 may be produced from one metal sheet having a unique thickness, or in other words leadframe 100 may be a single gauge leadframe. The thickness of die pad 102, the thickness of die pad 104 and the thickness of the contact pads 106 may be equal.

As visible in the side view of FIG. 1B, die pad 102 and 104 do not lie in a same plane. Lower surface 106-1 of the contact pads 106 and lower surface 102-1 of die pad 102 are arranged on a same first plane 110 indicated in FIG. 1B by a line 110. The upper surface 104-2 of die pad 104 lies in a second plane 112 indicated by a line 112. The second plane may be distant from the first plane by an overall thickness th of the semiconductor package into which leadframe 100 is to be integrated or which is to be formed around leadframe 100.

Figure 2A:
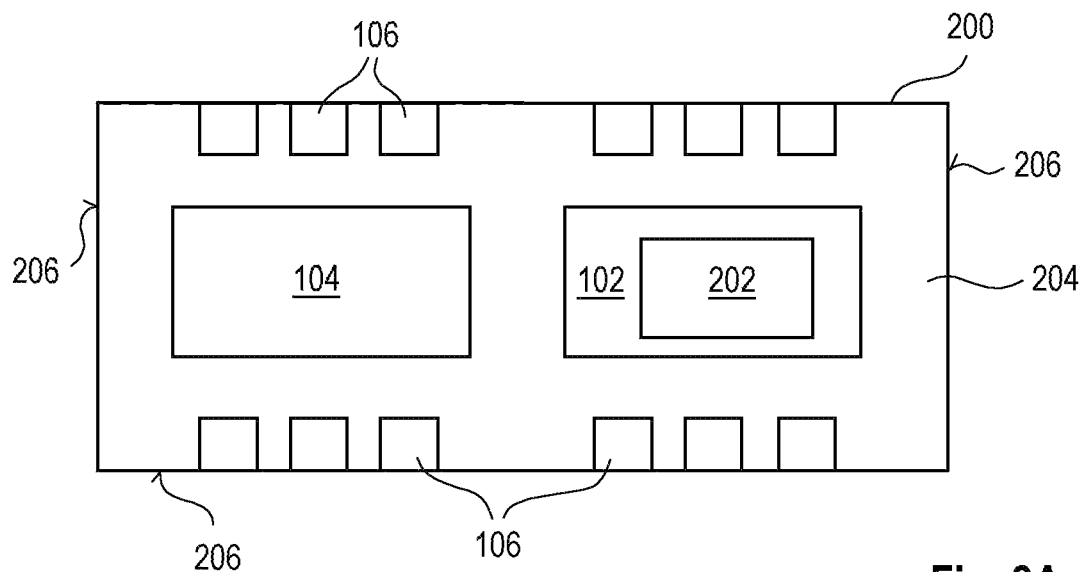
FIG. 2A schematically illustrates a top view of a semiconductor package in accordance with the disclosure.
Figure 2B:
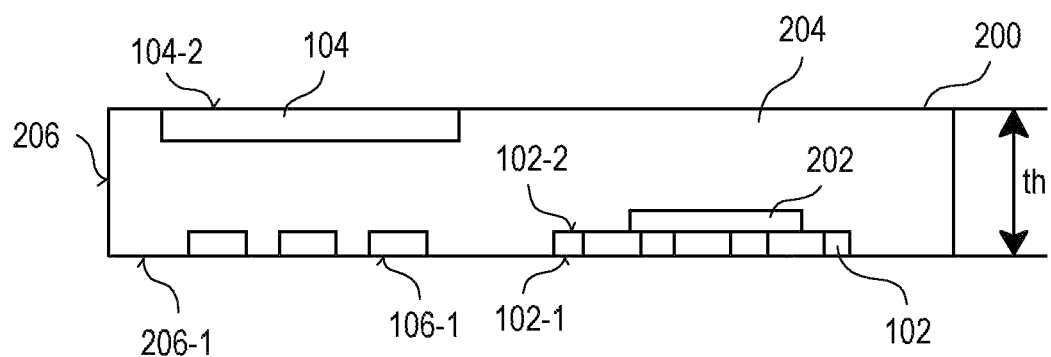
FIG. 2B schematically illustrates a side view of the semiconductor package of FIG. 2A.

FIG. 2A and FIG. 2B show a semiconductor package 200 in accordance with a first aspect of the disclosure. FIG. 2A shows a plan view of the semiconductor package 200. FIG. 2B shows a side view of the semiconductor package 200. Semiconductor package 200 may include the leadframe 100 with contact pads 106 and die pads 102 and 104 as discussed with reference to FIG. 1A and FIG. 1B.

Semiconductor package 200 may further include a first die 202 and a mold compound 204. For illustrative purposes only the mold compound 204 is shown as being transparent so as to allow seeing the die pads, the contact pads and the die inside the mold compound. The first die 202 may be attached to the upper surface 102-2 of first die pad 102. The mold compound 204 may cover the first die 202. Mold compound 204 may define an outer surface 206 of the semiconductor package 200. As can be seen in FIG. 2B, the upper surface 104-2 of second die pad 104, the lower surface 106-1 of contact pads 106 and the lower surface 102-1 of first die pad 102 may form part of the outer surface of semiconductor package 200.

Mold compound 204 may be formed in a molding process as discussed above. A lower surface 206-1 of semiconductor package 200 may form together with the lower surfaces 106-1 of the contact pads and the lower surface 102-1 of the first die pad a mounting surface of semiconductor package 200 allowing mounting the semiconductor package 200 on a printed circuit board (PCB) which is not shown.

Package 200 is shown as a leadless package. This is only an example and in no way limiting. The semiconductor package may also be configured as a leaded package with contact pads 106 extending out of the package.

FIG. 3A to FIG. 3F illustrate a method of forming a semiconductor package in accordance with a third aspect of the disclosure.

Figure 3A:
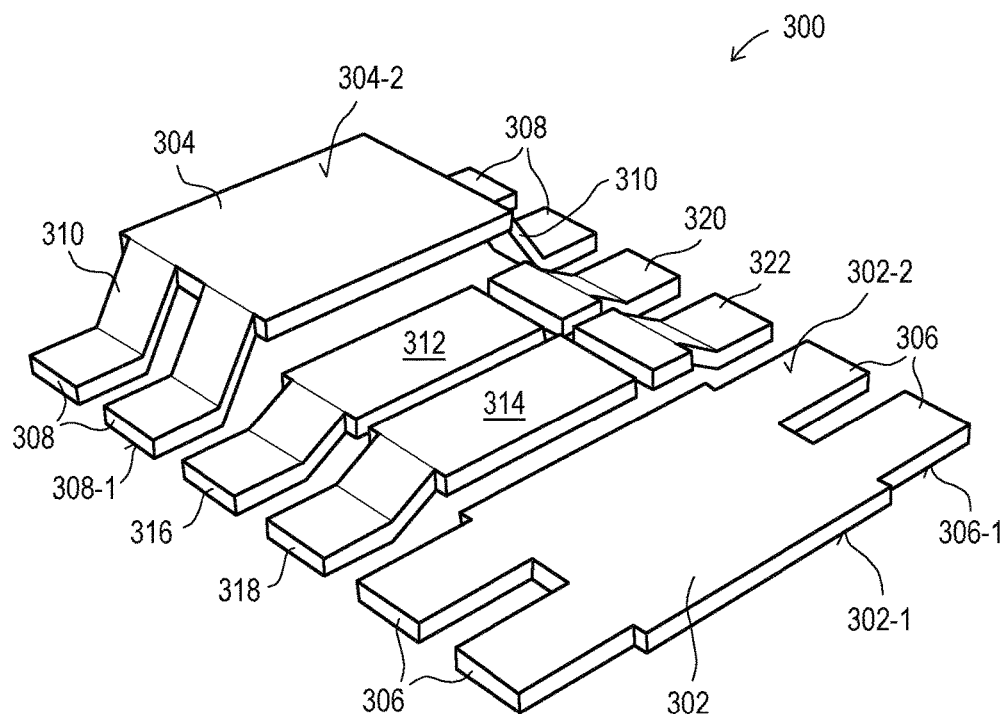
FIG. 3A schematically illustrates in a perspective view a leadframe in accordance with the disclosure.

FIG. 3A shows in a perspective view another exemplary leadframe 300 including a first die pad 302, a second die pad 304, a plurality of contact pads 306, 308, 316, 318, 320 and 322, a first bonding pad 312 and a second bonding pad 314. Leadframe 300 may be a single gauge leadframe. Leadframe 300 may be formed from a material as discussed above.

First die pad 302 may be formed in one piece with four contact pads 306. Contact pads 306 may be arranged on two opposite sides of first die pad 302, with two contact pads on each side. Contact pads 306 may be symmetrically arranged on two opposite sides of first die pad 302. First die pad 302 and contact pads 306 may be arranged in a same plane. Die pad 302 and contact pads 306 may have a same thickness. A lower surface 302-1 of the first die pad 302 and a lower surface 306-1 of contact pads 306 may be arranged in a first plane. The first plane may correspond to a mounting plane for the semiconductor package to be formed.

Second die pad 304 may be formed in one piece with four contact pads 308. The contact pads 308 may be arranged on two opposite sides of second die pad 304 with two contact pads 308 on each side. Contact pads 308 may be symmetrically placed on two opposite sides of second die pad 304. The contact pads 308 and the second die pad 304 may have a same thickness, the leadframe thickness. Second die pad 304 and contact pads 308 may not be arranged in a same plane. Contact pads 308 may be connected to second die pad 304 via bent leadframe portions 310. A lower surface 308-1 of contact pads 308 may be arranged in a same plane as lower surfaces 306-1 of contact pads 306. An upper surface 304-1 of second die pad 304 may be arranged in a second plane. The second plane may correspond to a plane formed by an upper surface of the semiconductor package to be formed. The upper surface may be opposite the mounting surface. In other words, upper surface 304-1 of second die pad 304 may be distant from lower surface 302-1 of first die pad 302 by the thickness of the semiconductor package to be formed.

First bonding pad 312 and second bonding pad 314 may be arranged on a third plane which may be different from the first plane and from the second plane. The third plane may be situated between the first and the second plane. In a lateral direction of leadframe 300 bonding pads 312 and 314 may be arranged between first die pad 302 and second die pad 304.

First bonding pad 312 may be connected via a bent leadframe portion to a contact pad 316. First bonding pad 312 may be formed in one piece with contact pad 316. Second bonding pad 314 may be formed in one piece with contact pad 318. Second bonding pad 314 may be connected via a bent leadframe portion to contact pad 318. On an opposite side of first and second bonding pads 312 and 314 contact pads 320 and 322 may be arranged in line with contact pads 306 and 308 on the opposite side. Contact pads 316 and 318 as well as contact pads 320 and 322 may be arranged in the first plane. Contact pads 320 and 322 may not be connected to bonding pads 312 and 314.

Figure 3B:
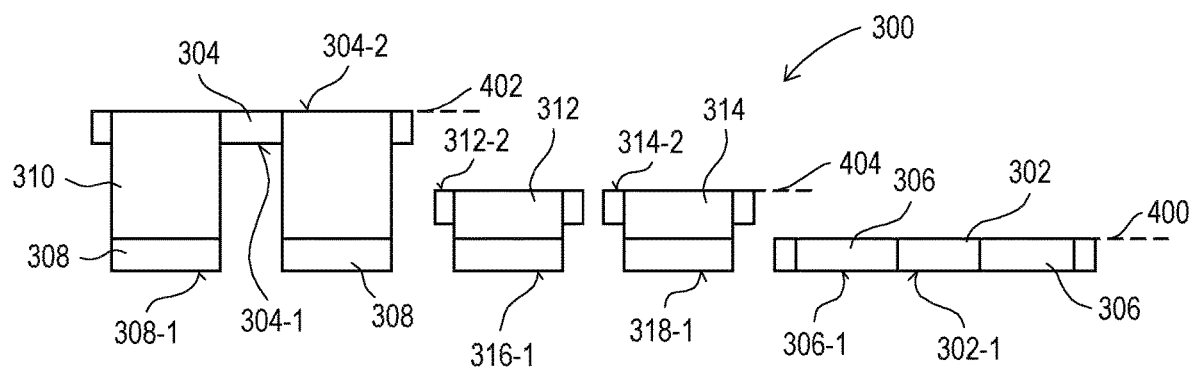
FIG. 3B schematically illustrates the leadframe of FIG. 3A in a cross-sectional view.

FIG. 3B illustrates in a side view the leadframe 300 with the three different planes. The three different planes may be obtained by bent-up and bent-down operations as explained above. The first plane 400 may be defined by the lower surface 302-1 of first die pad 302, by lower surface 306-1 of contact pads 306, by lower surfaces 316-1 and 318-1 of contact pads 316 and 318 and by lower surfaces 308-1 of contact pads 308. First plane 400 may be the mounting plane or mounting surface.

Second plane 402 may be defined by upper surface 304-2 of second die pad 304. Third plane 404 may be defined by upper surfaces 312-2 and 314-2 of bonding pads 312 and 314.

Figure 3C:
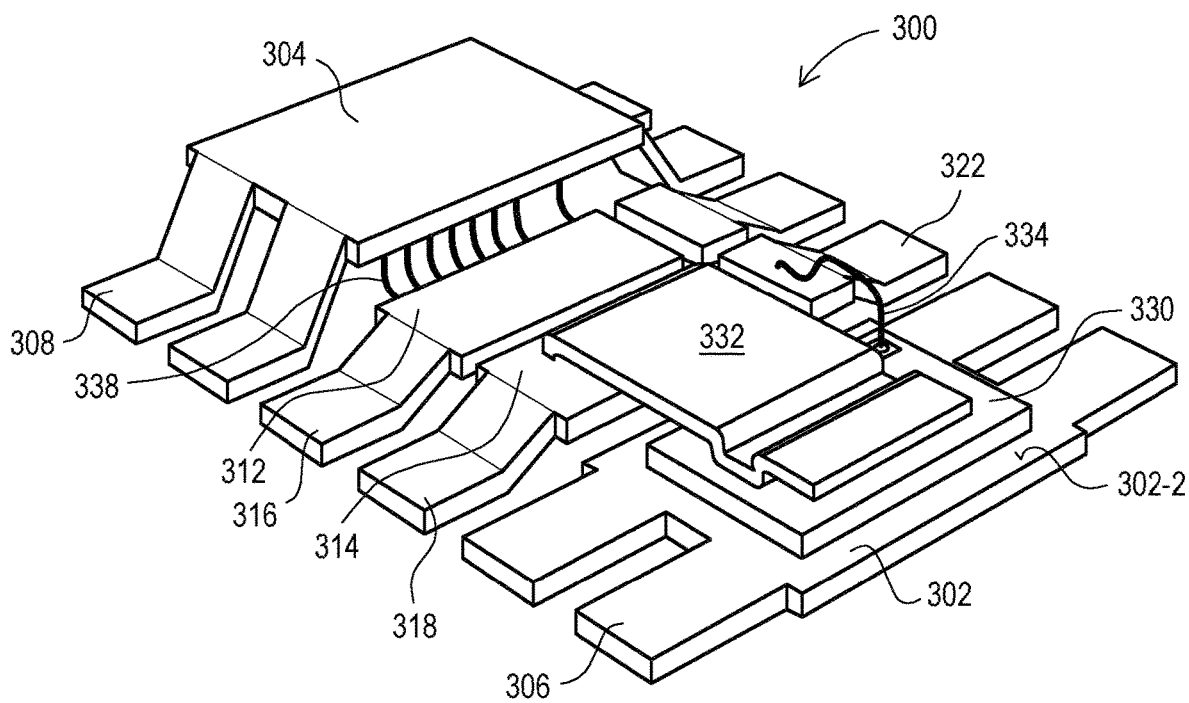
FIG. 3C schematically illustrates in a perspective view the leadframe of FIG. 3A after attaching a first and a second die.

FIG. 3C shows leadframe 300 after attachment of dies to the first and the second die pad. A first die 330 is attached to the upper surface 302-2 of first die pad 302. First die 330 may be attached to the first die pad by any means as discussed above. A clip 332 may connect an upper surface of die 330 electrically to second bond pad 318. Clip 332 may be configured to support a relatively high current of a power die 330. Clip 332 may be configured to have low thermal resistance. The upper surface of die 330 is thus connected electrically to contact pad 318 with a low electrical and thermal resistivity.

Die 330 may be a power MOSFET. The upper surface of die 330 may include a drain contact and a gate contact. The gate contact may be electrically connected via a bond wire 334 to contact pad 322.

Figure 3D:
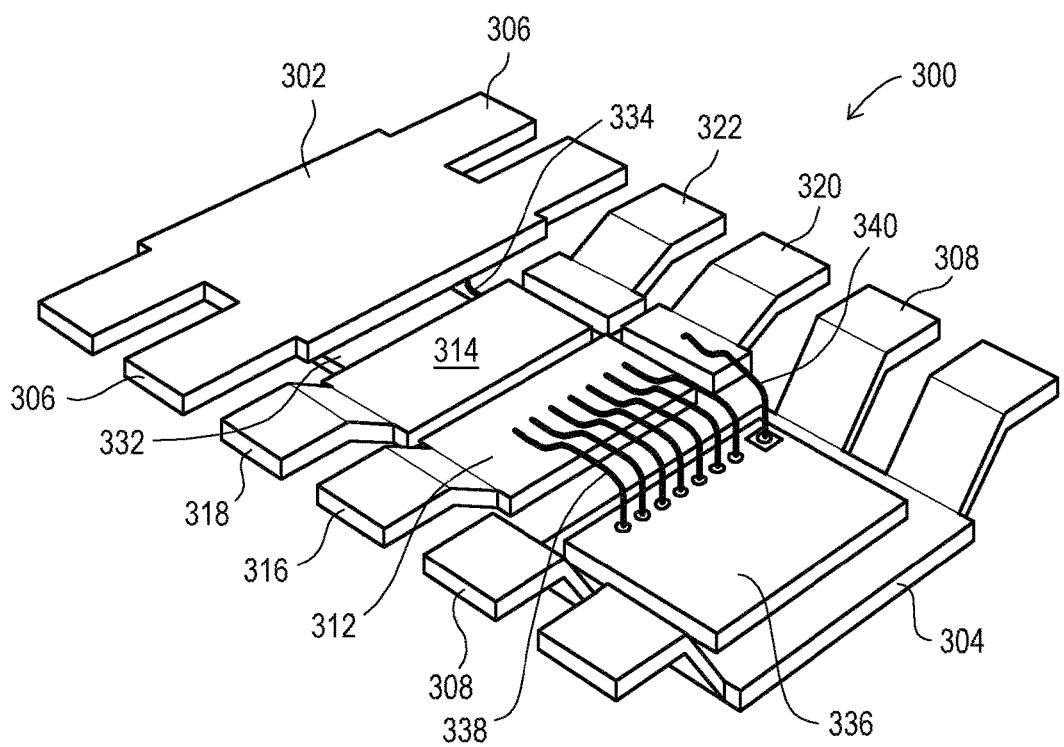
FIG. 3D schematically illustrates the leadframe of FIG. 3C turned upside down.

A second die 336 may be attached to a lower surface 304-1 of second die pad 304 (FIG. 3D). Second die 336 may be a power MOSFET. Second die 336 may be connected via bond wires 338 to a lower surface of second bonding pad 312.

FIG. 3D shows the leadframe 300 turned upside down. The power MOSFET 336 may be attached with a drain facing the die pad 304. A source of power MOSFET 336 may be electrically connected via bond wires 338 to a lower surface of first bonding pad 316. In FIG. 3C and FIG. 3D seven bond wires are shown. This is only an exemplary number of wire bonds. Another electrical connection, for example a clip like clip 332, may be used. In the example shown in FIG. 3D, a gate contact of power MOSFET 336 is connected via a bond wire 340 to contact pad 320. It is to be understood that the electrical connections shown are merely examples and other electrical connections or combinations of connection means may be used.

To summarize, leadframe 300 includes pads in three different planes which are parallel to each other. Leadframe 300 is formed from a single gauge leadframe sheet including bent-up and bent-down portions. Two dies 330 and 336 are mounted on leadframe 300 and electrically connected. One die is mounted on an upper side of the corresponding die pad and the other die is mounted on a lower side of the corresponding die pad. The two dies may be power devices. The two dies may be power MOSFETs.

Figure 3E:
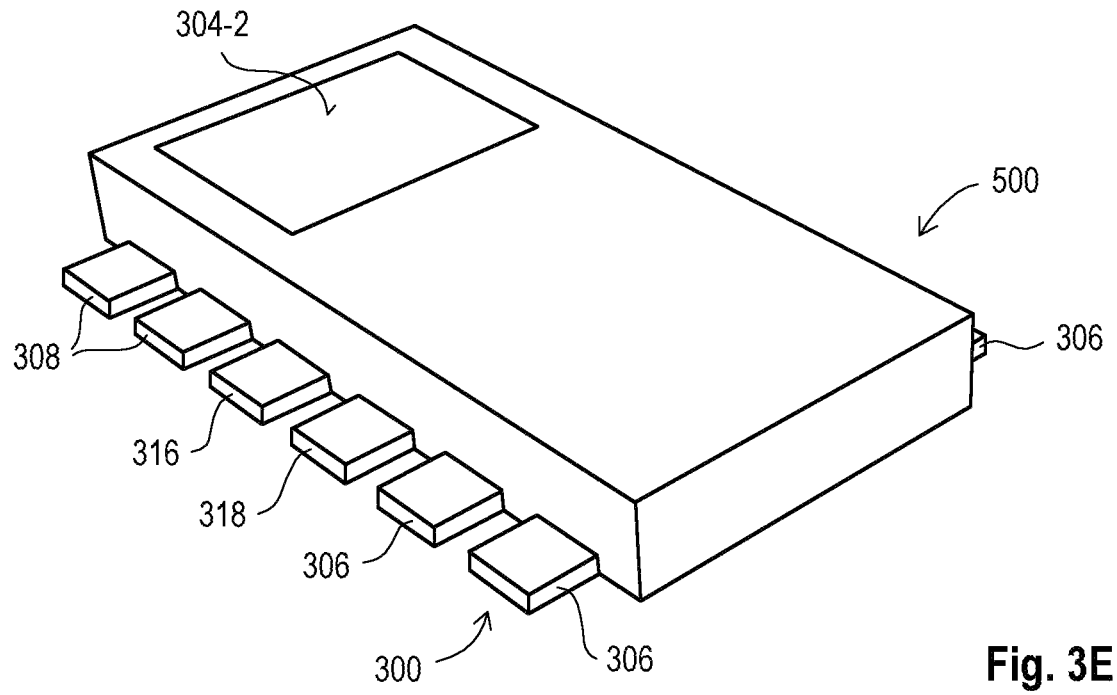
FIG. 3E schematically illustrates a semiconductor package in accordance with the disclosure which may include the assembly shown in FIG. 3C from the same view point.

FIG. 3E shows a semiconductor package 500 which may include leadframe 300 as shown in FIG. 3A to FIG. 3D. Semiconductor package 500 is a leaded package. Contact pads 306, 308, 316, 318, 320 and 322 extend out of the mold compound. Semiconductor package 500 may be formed by arranging leadframe 300 with mounted and connected dies 330 and 336 into a mold tool and molding a mold compound around leadframe 300 and the dies 330 and 336. A thickness of semiconductor package 500 corresponds to the distance between the first plane 400 and the second plane 402 as shown in FIG. 3B. Therefore, as shown in FIG. 3E, upper surface 304-2 of second die pad 304 is not covered by the mold compound.

Figure 3F:
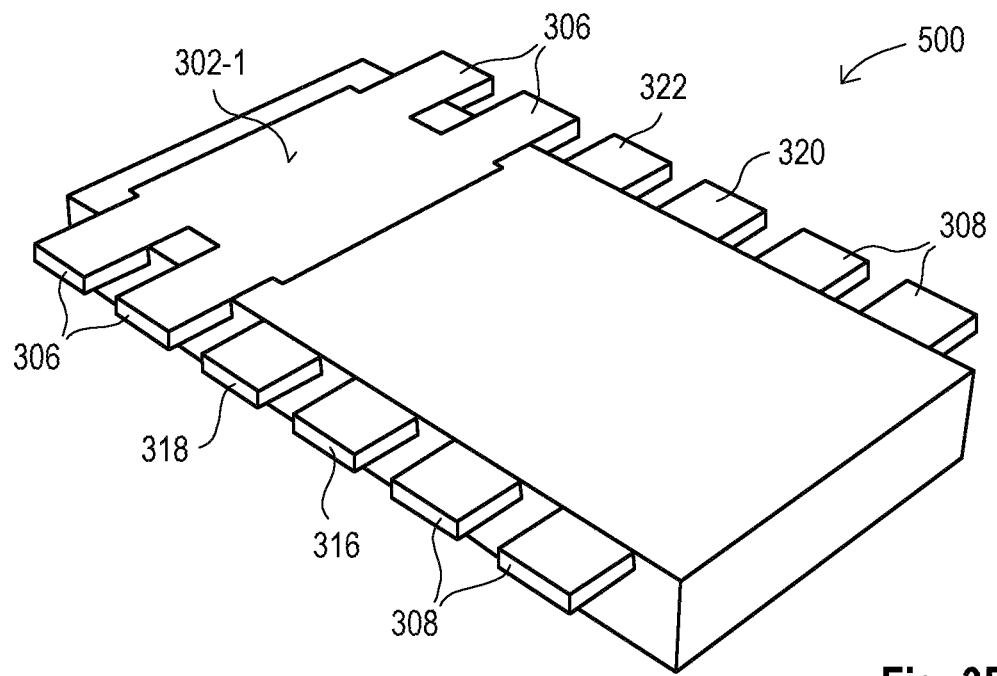
FIG. 3F schematically illustrates the semiconductor package of FIG. 3E turned upside down.

FIG. 3F shows semiconductor package 500 turned upside down. In other words, in FIG. 3F the mounting surface is on the upper side and visible. The lower surface 302-1 of first die pad 302 is not covered by the mold compound. Equally the lower surfaces of all contact pads are not covered. The molding process may be any known mold process, e.g. as discussed above. A film-assisted mold process may be used.

Upper surface of semiconductor 500 includes the uncovered upper surface 304-2 which allows cooling from an upper side of semiconductor package 500. Lower side of the semiconductor package 500 includes the uncovered lower surface 302-1 of the first die pad 302 which allows cooling from the lower side of the semiconductor package 500. Semiconductor package 500 allows cooling from both sides of the package.

Figure 4:
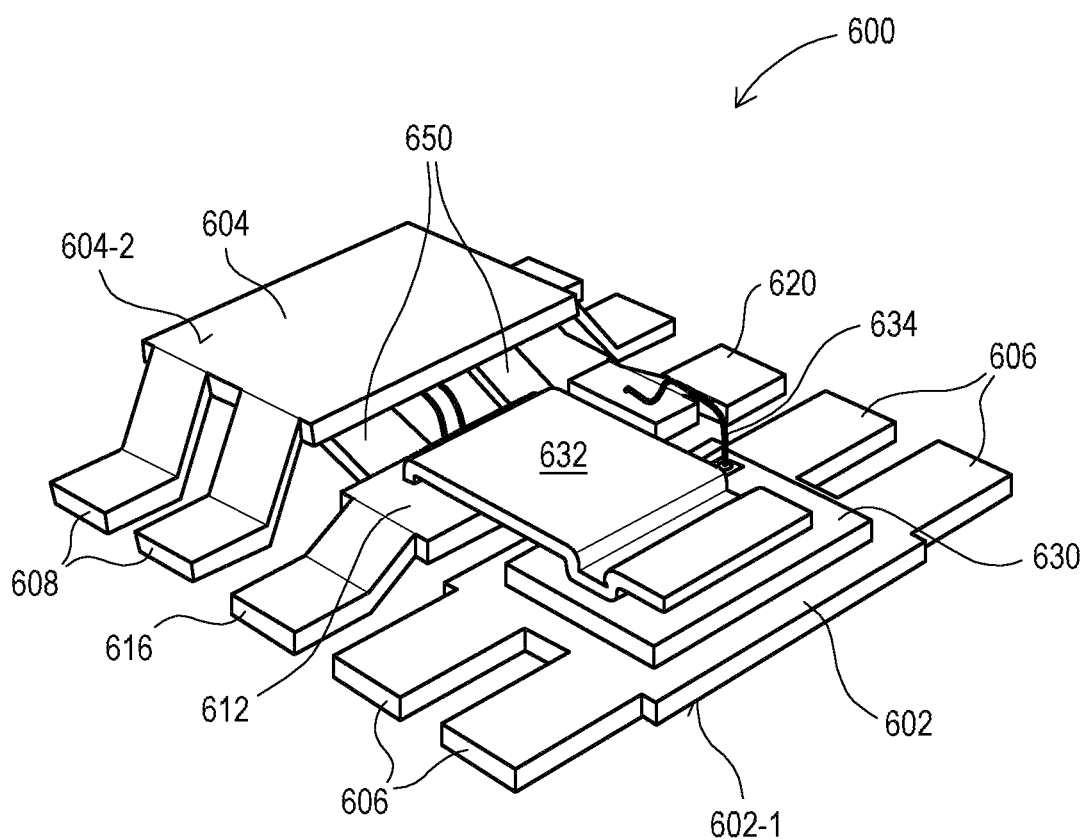
FIG. 4 schematically illustrates a leadframe with dual side cooling for a single chip in accordance with the disclosure.

FIG. 4 shows another example in accordance with the first or the second aspect of the disclosure. A leadframe 600 includes a first die pad 602, a second die pad 604, contact pads 606 formed in one piece with die pad 602 and contact pads 608 formed in one piece with second die pad 604. Leadframe 600 further includes a bonding pad 612 with a contact pad 616 formed in one piece and an opposite contact pad 620 separated from the bonding pad 612.

First die pad 602 may correspond to die pad 302 and second die pad 604 may correspond to second die pad 304 as shown in FIG. 3. All explanations and details given to these are applicable to the leadframe 600 as well.

Bonding pad 612 may correspond to bonding pad 312 as explained with reference to FIG. 3 and details given with reference to leadframe 300 apply equally to leadframe 600. As for leadframe 300 a lower surface of first die pad 602 may be arranged in a first plane, the upper surface 604-2 of second die pad 604 may be arranged in a second plane and an upper surface 612-2 of bonding pad 612 may be arranged in a third plane, the third plane being situated between the first and the second plane.

A die 630 may be attached to an upper surface 602-2 of first die pad 602. Die 630 may be a power component. Die 630 may be a power MOSFET. A source of the power MOSFET may be connected to die pad 602 and its drain on the upper surface of die 630 is shown to be connected by a clip 632 to an upper surface of bonding pad 612. A gate contact of die 630 may be connected via a bond wire 634 to contact pad 620.

Bonding pad 612 may be connected via two metal bars 650 to a lower surface of second die pad 604. Metal bars 650 may connect bonding pad 612 with a low thermal resistivity to second die pad 604. Bonding pad 612 may also be formed in one piece with second die pad 604.

FIG. 4 shows an assembly with a leadframe 600 with only one die 630 mounted upon. In this example the second die pad may be used as a heat spreader rather than for supporting a die. After molding a package using a mold compound as explained with reference to FIG. 3E and FIG. 3F, an upper surface 604-2 of die pad 604 is not covered by the mold compound and forms part of the outer surface of the package. Equally a lower surface 602-1 of first die pad 602 is not covered by the mold compound and arranged on a lower surface of the package. Therefore, a cooling of the chip or die 630 is possible from the lower side and from the upper side of the package. It is a dual side cooling package.

FIG. 5A to FIG. 5F illustrate a method of forming a further semiconductor package in accordance with the third aspect of the disclosure.

Figure 5A:
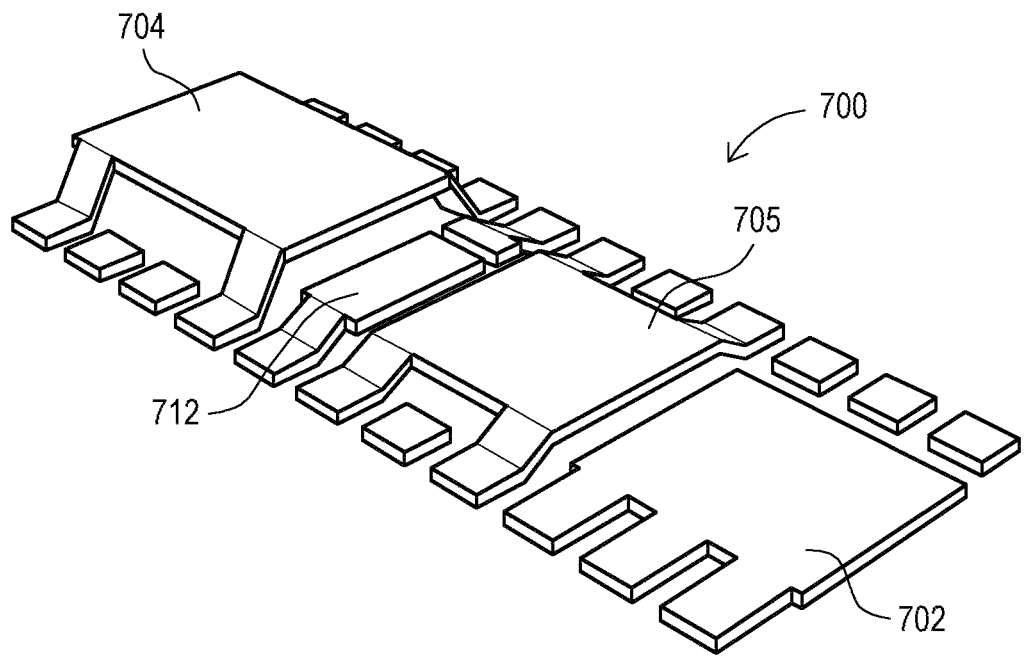
FIG. 5A schematically illustrates in a perspective view another leadframe in accordance with the disclosure.

FIG. 5A shows in a perspective view a leadframe 700. Leadframe 700 includes a first die pad 702, a second die pad 704, a third die pad 705 and a bonding pad 712. Leadframe 700 includes a plurality of contact pads.

Figure 5B:
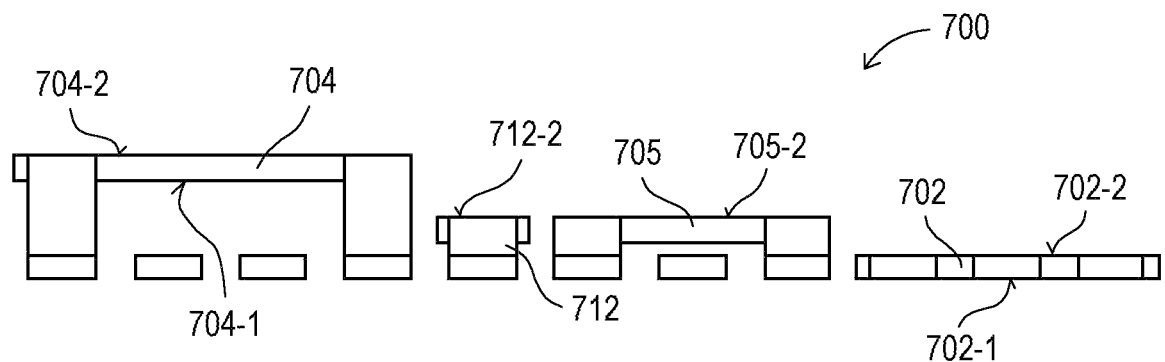
FIG. 5B schematically illustrates the leadframe of FIG. 5A in a cross-sectional view.

FIG. 5B shows leadframe 700 in a side view. The different planes in which first die pad 702, second die pad 704, third die pad 705 and bonding pad 712 are arranged are best understood with reference to FIG. 5B. A mounting surface is in the first plane which is defined by the lower surface 702-1 of first die pad 702 and the lower surfaces of the contact pads. A second plane is defined by the upper surfaces 704-2 of second die pad 704. As for leadframe 300 a distance between the second plane and the first plane corresponds to a thickness of the package to be formed. An upper surface 705-2 of the third die pad 705 and an upper surface 712-2 of the bonding pad 712 are arranged in a third plane. The third plane is arranged in-between the first plane and the second plane. The third plane may be completely covered by a mold compound of the package to be formed.

In difference to the example shown in FIG. 3, the first die pad 702 is formed in one piece with three contact pads arranged on one side of the first die pad. Contact pads arranged on the opposite side of the first die pad 702 are not in electrical connection to the die pad. It is to be understood that electrical connections to the contact pads from the die pads or bonding pads may be done as necessary according to the dies to be mounted. In the same way, the second die pad 704 is formed in one piece with two contact pads on each of two opposite sides of the second die pad 704. The contact pads may be arranged symmetrically on the two opposite sides. In other words, the second die pad 704 is formed in one piece with four contact pads which may be arranged symmetrically. The bending leadframe portions connecting the second die pad 704 to the contact pads are arranged at corners of the second die pad. In-between the connected contact pads are arranged two further contact pads on each side of the two opposite sides which are not electrically connected to the second die pad. The third die pad is formed in one piece with four contact pads and has one contact pad lying in-between not connected to the die pad.

Figure 5C:
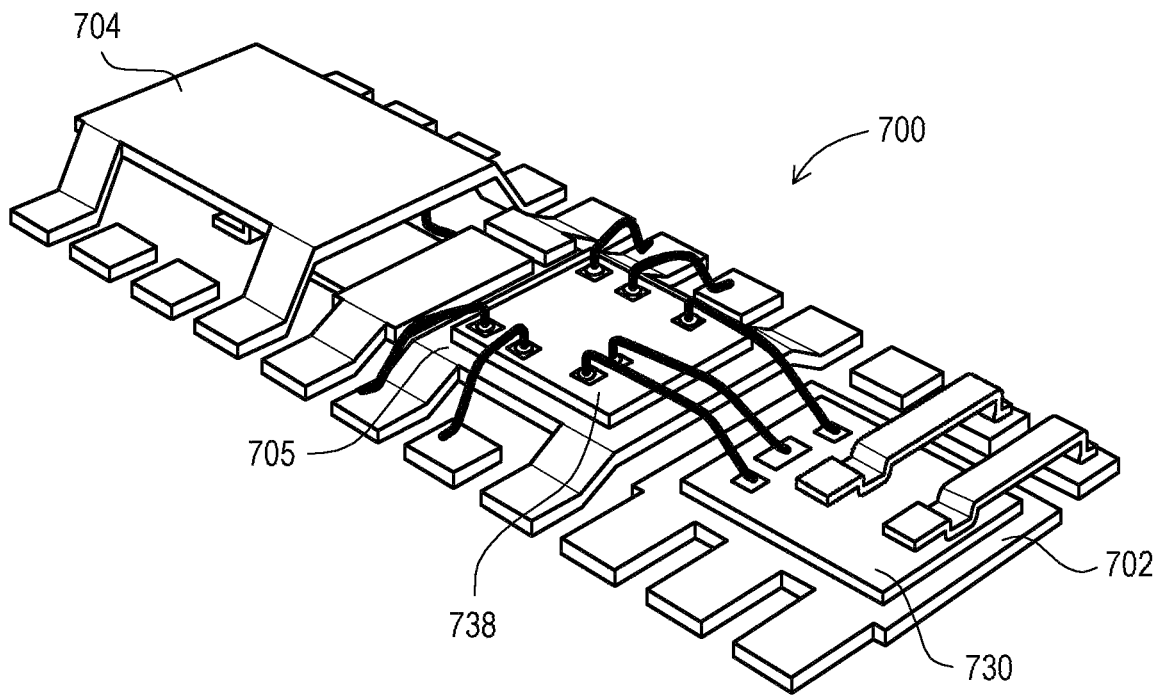
FIG. 5C schematically illustrates in a perspective view the leadframe of FIG. 5A with three dies mounted thereon.
Figure 5D:
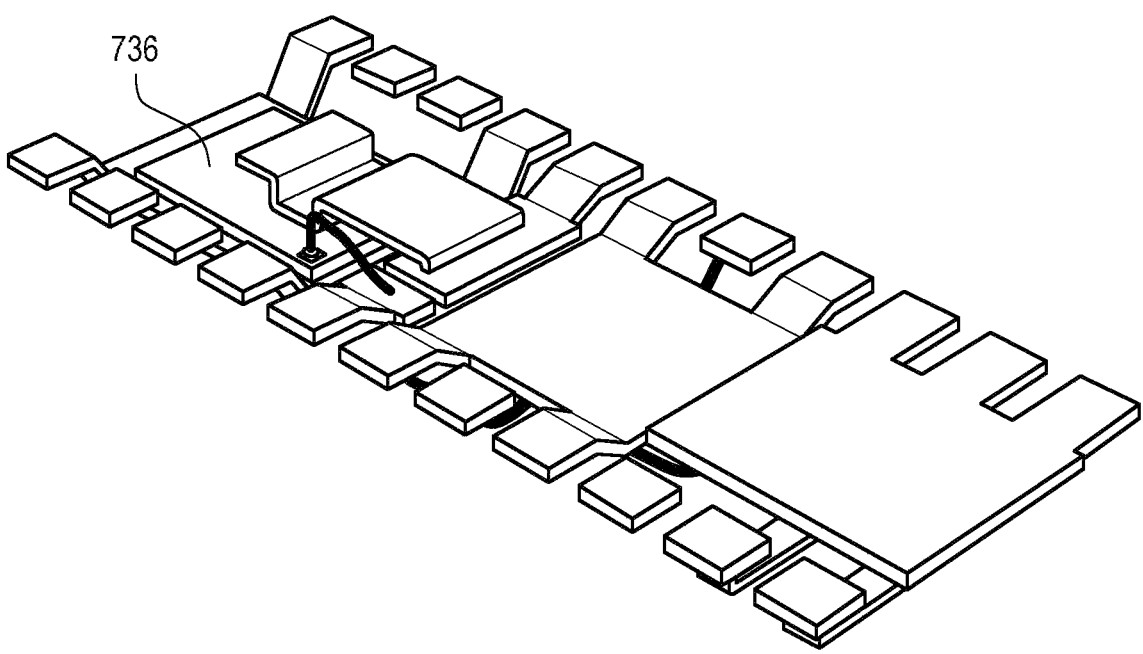
FIG. 5D schematically illustrates the assembly of FIG. 5C turned upside down.

FIG. 5C and FIG. 5D show leadframe 700 with three dies 730, 736 and 738 mounted thereto. FIG. 5C is a perspective view of the upper side and FIG. 5D is a perspective view of the lower side of leadframe 700. Die 730 is attached to an upper side 702-2 of die pad 702. Die 738 is attached to an upper side 705-2 of third die pad 705. Third die 736 is attached to a lower side 704-1 of second die pad 704. Die 736 is only visible in FIG. 5D. Dies 730 and 736 may be power devices. Dies 730 and 736 may be power MOSFETs. Dies 730 and 736 may require a cooling. Die 738 may be a digital circuit. Die 738 may be a controller chip. Die 738 may be a lower power device without the necessity to be cooled.

Electrical interconnections between contact pads and the first die 730 respectively the third die 738 may be provided by clips or by bond wires. Second die 736 may be electrically and thermally connected via a clip to bonding pad 712 as shown in FIG. 5D.

The assembly as shown in FIG. 5C and FIG. 5D may thus integrate a controller chip for controlling of one or two power devices on a same leadframe 700.

Figure 5E:
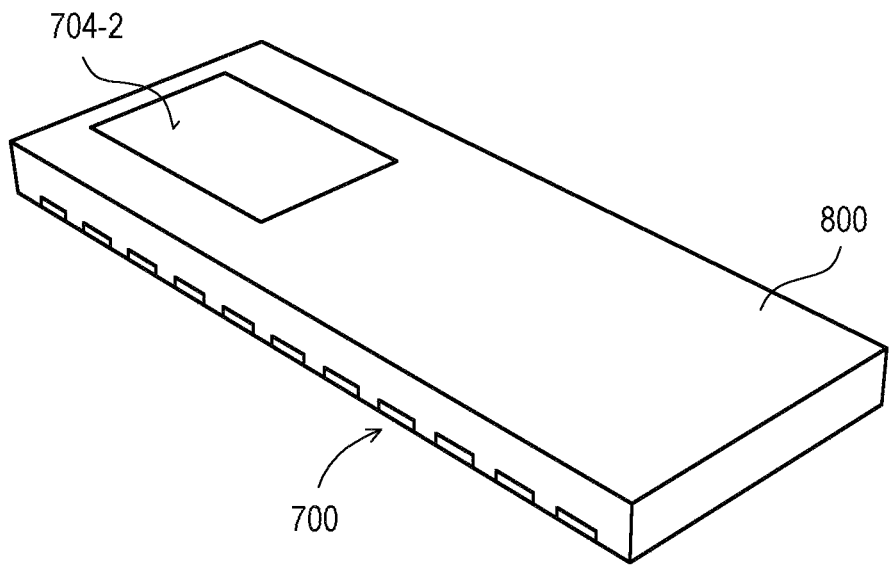
FIG. 5E schematically illustrates a semiconductor package in accordance with the disclosure which may include the assembly shown in FIG. 5C.
Figure 5F:
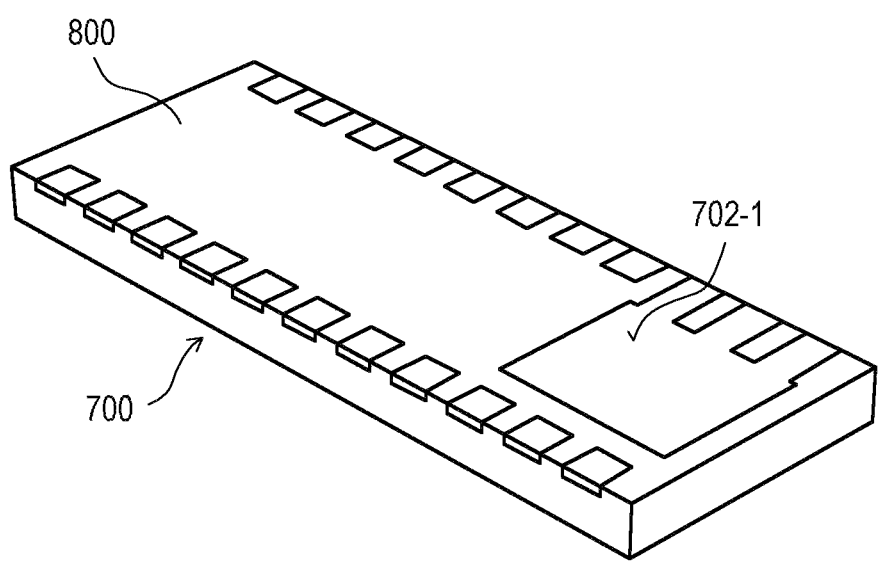
FIG. 5F schematically illustrates the semiconductor package of FIG. 5E turned upside down.

FIG. 5E and FIG. 5F show a semiconductor package 800 which may be obtained after molding a mold compound around leadframe 700. Molding may be effectuated as explained above. Semiconductor package 800 may be a leadless package. The contact pads do not extend out of the semiconductor package 800. Only the lower surfaces and one side face of the contact pads are accessible. This is not to be understood to be limiting. Molding could be effectuated in a way to obtain a leaded package.

FIG. 5E shows in a perspective view the upper side of semiconductor package 800. FIG. 5F shows in a perspective view the lower side of package 800. FIG. 5F shows the mounting surface of semiconductor package 800. The upper surface 704-2 of die pad 704 is not covered by the molding compound and allows direct cooling of die 736 mounted to the lower surface 704-1 of second die pad 704. The lower surface 702-1 of first die pad 702 is not covered by the molding compound and allows a direct cooling of die 730 mounted to the upper surface 702-2 of first die pad 702.

Figure 6:
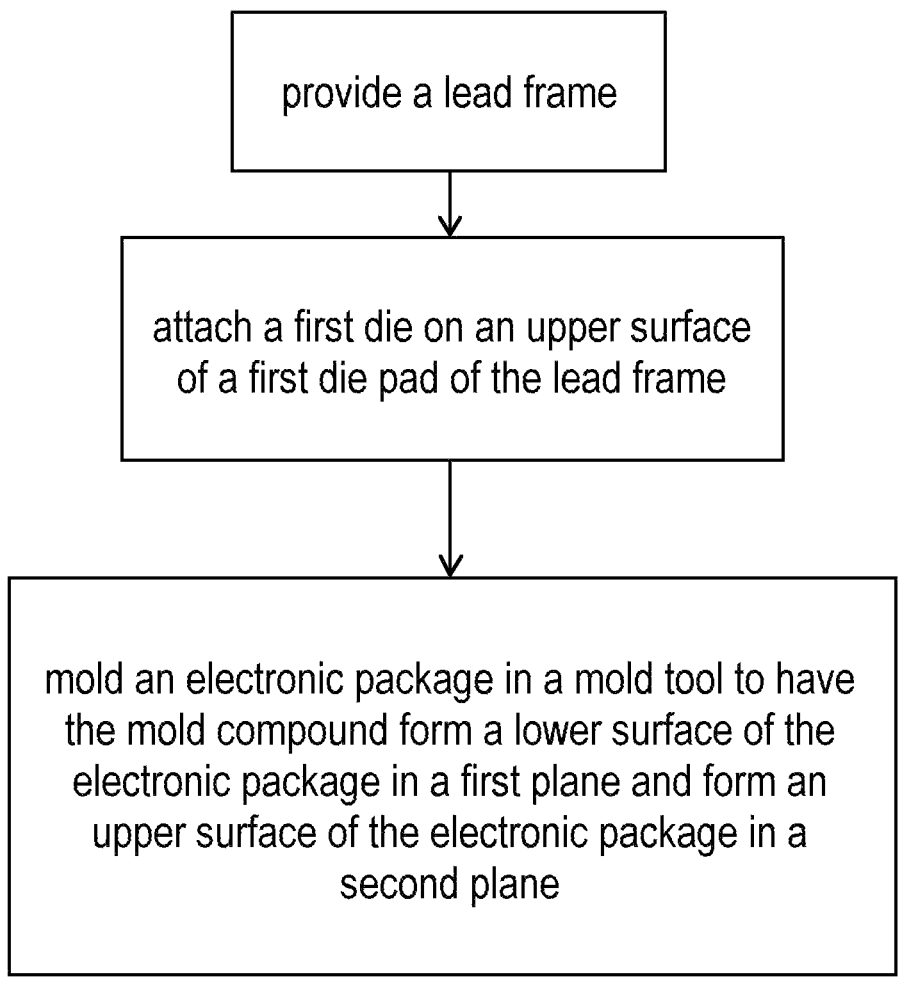
FIG. 6 schematically illustrates a flow chart specifying a method for producing a semiconductor package in accordance with the disclosure.

FIG. 6 summarizes in a flow chart the method of forming a semiconductor package according to the third aspect of the disclosure. A leadframe is provided. The leadframes 100, 300 and 700 discussed above are examples for the leadframe provided. The provided leadframe may include a first die pad and a second die pad. A lower surface of the first die pad may be arranged on a first plane and an upper surface of the second die pad may be arranged on a second plane distant from the first plane by an overall thickness of the semiconductor package to be formed. In other words, the lower surface of the first die pad and the upper surface of the second die pad may form part of an outer surface of the package to be formed. The leadframe may also include a plurality of contact pads.

A first die may be attached on an upper surface of the first die pad of the leadframe. In other words, the first die may be attached to a surface of the first die pad which is opposite to the surface of the die pad which forms part of the outer surface of the package to be formed.

A semiconductor package may be molded in a mold tool to have the mold compound form a lower surface of the semiconductor package in the first plane and to form an upper surface of the semiconductor package in the second plane. The first plane may be in a mounting surface.

A semiconductor may be provided including an upper cooling surface and a lower cooling surface, both cooling surfaces provided by a same single gauge leadframe. It is an effect that no stack construction is needed to provide an upper cooling surface. It is an effect that a bent-up, bent-down leadframe may be provided with parallel die pads and thus cooling surfaces may be provided in a same plane than an outer package surface without a need of any grinding or any further adjustment step which would impose additional stress. It is an effect that during a molding process no mold flash is deposited on the cooling surfaces provided by the parallel die pads. It is an effect that a dual side cooled package may be provided in less production steps.

Figure 7A:
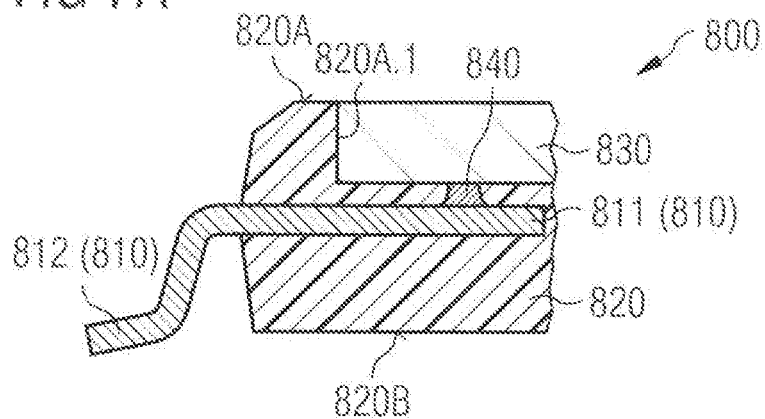
FIG. 7 includes FIG. 7A to 7C and schematically illustrates a semiconductor package in accordance with the disclosure.
Figure 7B:
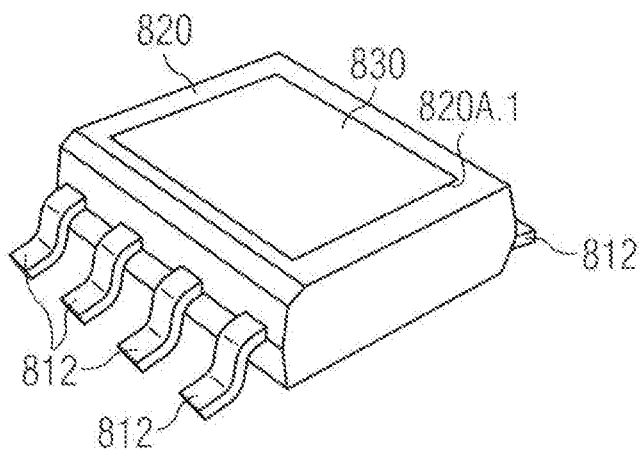
Figure 7C:
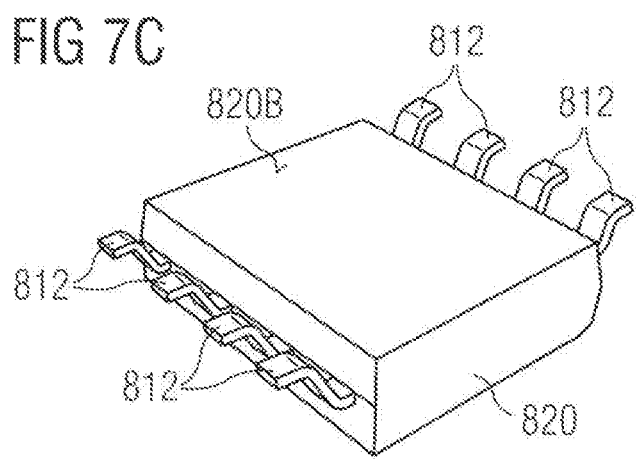

FIG. 7 includes FIG. 7A to FIG. 7C and shows an example of a semiconductor package in accordance with the fourth aspect of the disclosure and this example shows the arrangement of an exposed semiconductor die at the upper surface of the package for the purpose of top side cooling. In FIG. 7A only the left half of the semiconductor package is depicted, the right half can be arranged in an equal manner. The semiconductor package 800 of FIG. 7 includes a leadframe structure 810 including a die connect region 811 and a plurality of leads 812, a mold compound 820 disposed around at least a portion of the leadframe structure 810, wherein the mold compound 820 may include a first main face 820A and a second face 820B opposite to the first main face 820A. The mold compound 820 furthermore includes a recess 820A.1 formed in the first main face 820A, and a semiconductor die 830 disposed in the recess 820A.1. The semiconductor die 830 can be connected to the die connect region 811 by a metallic pillar 840, e.g. a Cu pillar. The semiconductor die 830 is exposed to the outside.

The semiconductor package of the fourth aspect can therefore be called a thermally enhanced package since excessive heat produced in the semiconductor die 830 will be dissipated not only through the Cu pillar 840 and the leadframe structure 810, but also through the upper surface of the semiconductor die 830 to the outside, e.g. to an external heatsink, e.g. via a thermal interface material.

According to an example of the semiconductor package of the fourth aspect, the size of the recess 820A.1 corresponds to the size of the semiconductor die 830 so that when the semiconductor die 830 is inserted in the recess 820A.1, an upper surface of the semiconductor die 830 will be coplanar with the first main face 820A of the mold compound 820.

According to an example of the semiconductor package of the fourth aspect such as that shown in FIG. 7, the recess 820A.1 is formed in the first main face 820A, i.e. the upper main face which is disposed remote from the leads 812. However, alternatively the recess can also be formed in the lower main face 820B, an example of which will be shown below.

According to an example of the semiconductor package of the fourth aspect, the leadframe structure 810 includes a plane portion and a bent portion. The plane portion includes the die attach portion 811 and the bent portion includes the leads 812. According to a further example thereof, essentially the complete plane portion of the leadframe structure 810 is embedded by the mold compound.

According to an example of the semiconductor package of the fourth aspect, as can be seen in FIG. 7B, a considerable amount of the upper surface of the package is occupied by the upper surface of the semiconductor die 830. According to an example, 60% or more of the upper surface of the package can be occupied by the upper surface of the semiconductor die 830, more specifically 70% or more, more specifically 80% or more, more specifically 90% or more.

According to an example of the semiconductor package of the fourth aspect, the mold compound may include two or more semiconductor dies which can be disposed in respective two or more recesses in which case the two aspects of integration and thermally enhanced performance can be optimally combined. According to a further example, a first die could be a power semiconductor die and a second die could be a either one of a driver die, a controller die, a power management die, or any kind of a signal processing die. The dies could be disposed in respective recesses formed in either one of the first and second main faces of the mold compound, or in opposite main faces. Specific examples thereof will be presented below.

According to an example of the semiconductor package of the fourth aspect, the semiconductor package is based on a single gauge leadframe. Single gauge leadframes are known to be relatively cheap as compared to dual gauge leadframes.

According to an example of the semiconductor package according to the fourth aspect, the semiconductor package can be fabricated in the form of either one of a leaded package or a leadless package. The examples as shown in FIG. 7, FIG. 8, and FIG. 9 are leaded packages and the example shown in FIG. 10 is a leadless package.

Figure 8A:
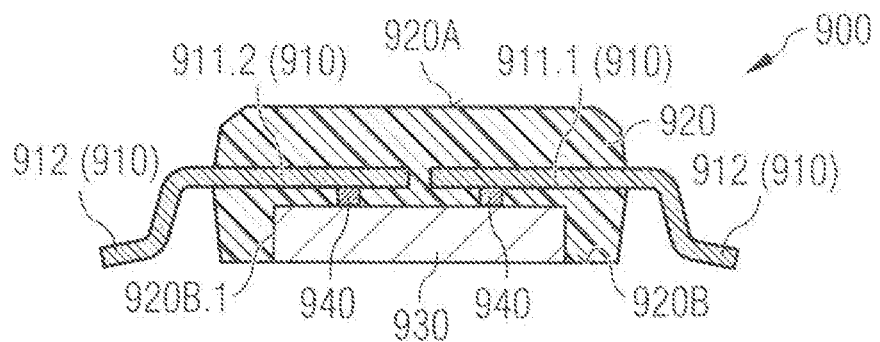
FIG. 8 includes FIG. 8A to 8C and schematically illustrates a semiconductor package in accordance with the disclosure.
Figure 8B:
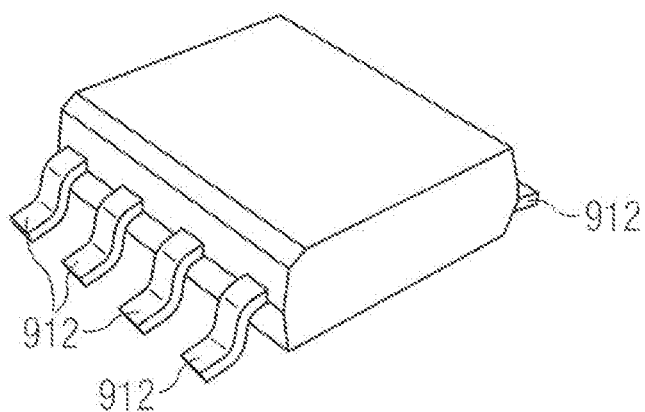
Figure 8C:
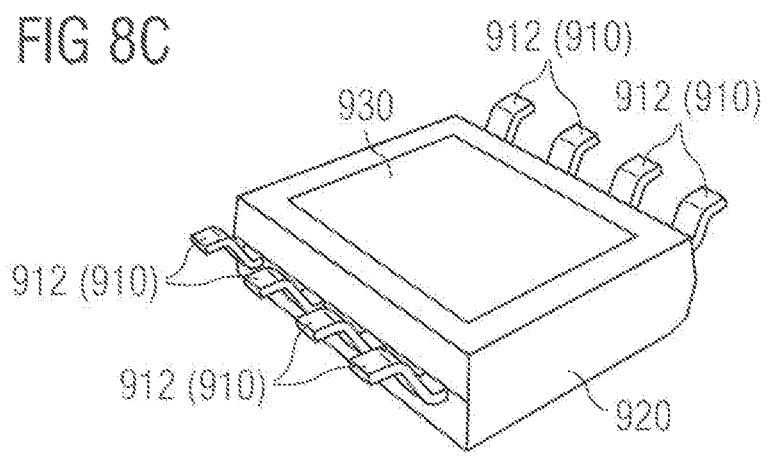
Figure 9A:
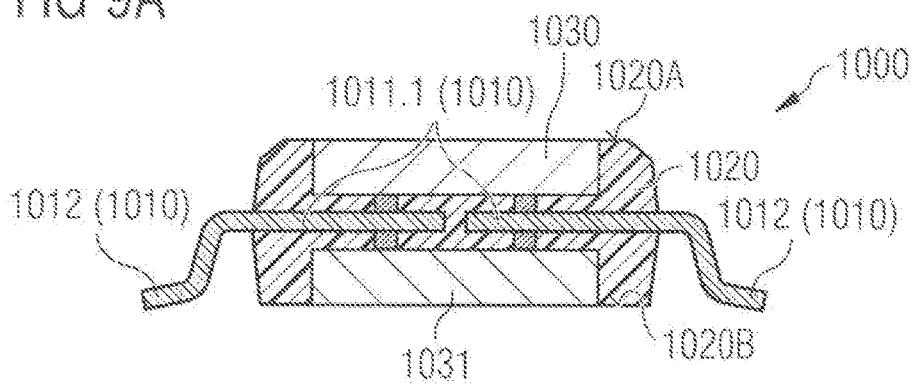
FIG. 9 includes FIG. 9A to 9E and schematically illustrates a semiconductor package in accordance with the disclosure.
Figure 9B:
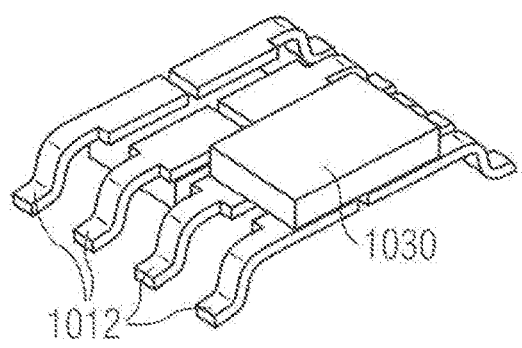
Figure 9C:
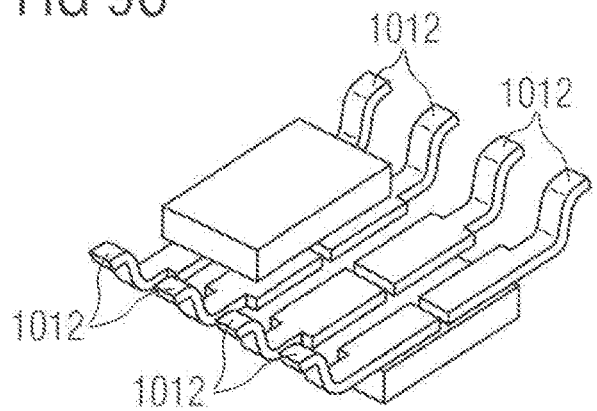
Figure 9D:
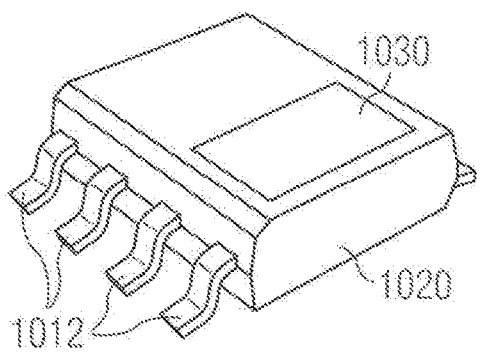
Figure 9E:
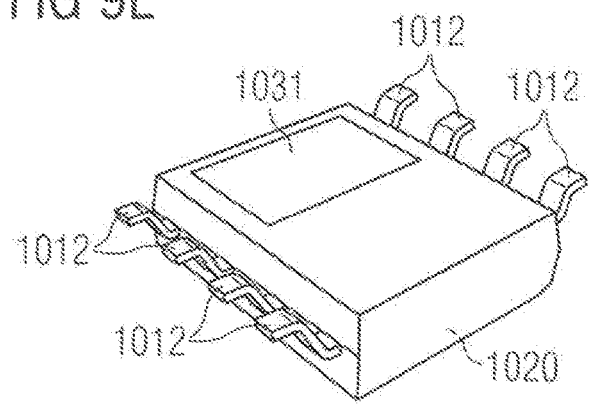
Figure 10A:
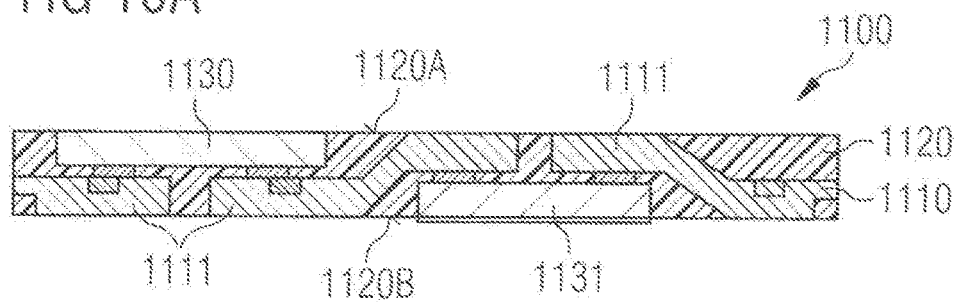
FIG. 10 includes FIG. 10A to 10D and schematically illustrates a semiconductor package in accordance with the disclosure.
Figure 10B:
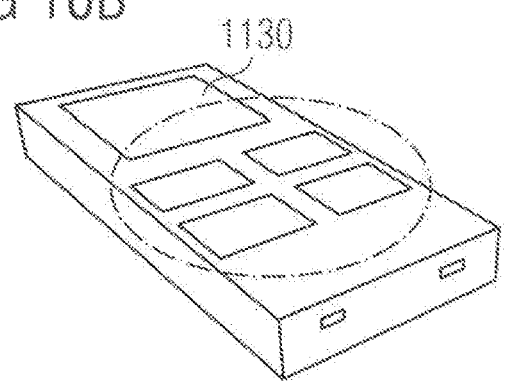
Figure 10C:
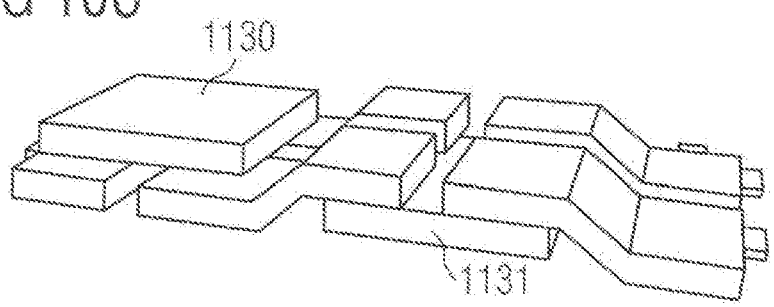
Figure 10D:
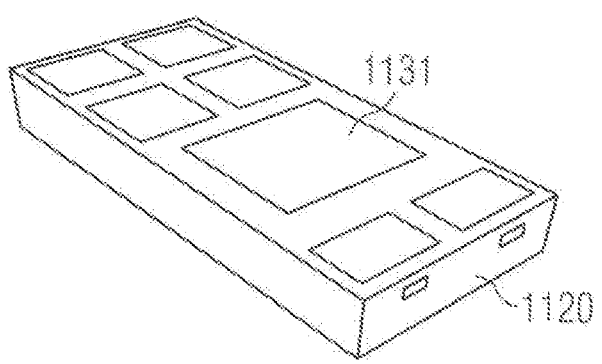

FIG. 8 includes FIG. 8A to FIG. 8C and shows an example of a semiconductor package in accordance with the fourth aspect of the disclosure and this example shows the arrangement of an exposed semiconductor die at the bottom surface of the package for the purpose of bottom side cooling. The semiconductor package 900 of FIG. 8 includes a leadframe structure 910 including two die connect regions 911.1 and 911.2 and a plurality of leads 912, a mold compound 920 disposed around at least a portion of the leadframe structure 910, wherein the mold compound 920 may include a first main face 920A and a second main face 920B opposite to the first main face 920A. The mold compound 920 furthermore includes a recess 920B.1 formed in the second main face 920B, and a semiconductor die 930 disposed in the recess 920B.1. The semiconductor die 930 can be connected to the die connect regions 911.1 and 911.2 by metallic pillars 940, in particular Cu pillars. The semiconductor die 930 is exposed to the outside.

According to an example of the semiconductor package of FIG. 8, the semiconductor die 930 includes a backside metallization which it to be soldered on a PCB on the customer's side. According to an example thereof, the semiconductor die 930 is an IGBT transistor including source and gate pads on an upper surface thereof and a drain pad on a lower surface thereof wherein the drain pad as usually covers essentially the complete backside main face of the semiconductor die 930. The two die connect regions 911.1 and 911.2 are connected to the source and gate pads, respectively, by the metallic pillars 940.

FIG. 9 includes FIG. 9A to FIG. 9E and shows an example of a semiconductor package in accordance with the fourth aspect of the disclosure and this example shows the arrangement of two exposed semiconductor dies on opposite sides of the package. The semiconductor package 1000 of FIG. 9 includes a leadframe structure 1010 including die connect regions 1011 and a plurality of leads 1012, a mold compound 1020 disposed around at least a portion of the leadframe structure 1010, wherein the mold compound 1020 may include a first main face 1020A and a second main face 1020B opposite to the first main face 1020A. The mold compound 1020 furthermore includes a first recess formed in the first main face 1020A, and a second recess formed in the second main face 1020B, and a first semiconductor die 1030 disposed in the first recess 1020A.1 and a second semiconductor die 1031 disposed in the second recess. The semiconductor dies 1030 and 1031 can be connected to the die connect regions 1011 by metallic pillars, in particular Cu pillars. The semiconductor dies 1030 and 1031 are both exposed to the outside to allow for double-side cooling, wherein the semiconductor package 1000 may be mounted on a PCB so that excessive heat will be dissipated through the lower main face of the second semiconductor die 1031 to the PCB, and in addition a heatsink may be mounted onto the first semiconductor die 1030 so that even more excessive heat will be dissipated through the upper main face of the first semiconductor die 1030 to the heatsink.

FIG. 10 includes FIG. 10A to FIG. 10D and shows an example of a semiconductor package in accordance with the fourth aspect of the disclosure and this example shows the arrangement of two exposed semiconductor dies on opposite sides of a leadless semiconductor package. The semiconductor package 1100 of FIG. 10 includes a leadframe structure 1110 including die connect regions 1111 and a plurality of leads 1112, a mold compound 1120 disposed around at least a portion of the leadframe structure 1110, wherein the mold compound 1120 may include a first main face 1120A and a second main face 1120B opposite to the first main face 1120A. The mold compound 1120 furthermore includes a first recess formed in the first main face 1120A, and a second recess formed in the second main face 1120B, and a first semiconductor die 1130 disposed in the first recess and a second semiconductor die 1131 disposed in the second recess. The semiconductor dies 1130 and 1131 can be connected to the die connect regions 1111 by metallic pillars, e.g. Cu pillars. The semiconductor dies 1130 and 1131 are both exposed to the outside to allow for double-side cooling, wherein the semiconductor package 1100 may be mounted on a PCB so that excessive heat will be dissipated through the lower main face of the second semiconductor die 1131 to the PCB, and in addition a heatsink may be mounted onto the first semiconductor die 1130 so that even more excessive heat will be dissipated through the upper main face of the first semiconductor die 1130 to the heatsink. Furthermore, heat can not only be dissipated by the semiconductor dies 1130 and 1131, but also by the die connect regions as, for example, in the oval framed regions in FIG. 10A and FIG. 10B in which heat can be dissipated through the lower main face of the second semiconductor die 1131 as well as through the die connect regions 1111 to which the second semiconductor die 1131 is connected.

While the invention has been illustrated and described with respect to one or more implementations, alterations and/or modifications may be made to the illustrated examples without departing from the spirit and scope of the appended claims. In particular regard to the various functions performed by the above described structures, the terms used to describe such structures are intended to correspond, unless otherwise indicated, to any structure which performs the specified function of the described structure (e.g., that is functionally equivalent), even though not structurally equivalent to the disclosed structure which performs the function in the herein illustrated exemplary implementations of the invention.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "include". Also, the term "exemplary" is merely meant as an example, rather than the best or optimal. It is also to be appreciated that features and/or elements depicted herein are illustrated with particular dimensions relative to each other for purposes of simplicity and ease of understanding, and that actual dimensions may differ substantially from that illustrated herein.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A leadframe, that is to be incorporated into a semiconductor housing, the leadframe comprising:
    a first die connection pad and at least one second die connection pad;
    a multiplicity of contact connection pads, wherein an underside of the multiplicity of contact connection pads and an underside of the first die connection pad are arranged in a first plane;
    wherein a top side of the at least one second die connection pad is arranged in a second plane, which is arranged at a distance from the first plane, and the top side of the at least one second die connection pad is in a different plane than a top side of the first die connection pad;
    wherein a first number from the multiplicity of contact connection pads are applied on two opposite substantially linear sides of the first die connection pad and fabricated in one piece with the first die connection pad; and
    wherein a second number from the multiplicity of contact connection pads are applied on two opposite substantially linear sides of the at least one second die connection pad that are aligned with the two opposite substantially linear sides of the first die connection pad and fabricated in one piece with the at least one second die connection pad.

2. The leadframe of claim 1,
wherein the first die connection pad, the at least one second die connection pad and the multiplicity of contact connection pads have an identical leadframe thickness.

3. The leadframe of claim 1,
wherein the second number of contact connection pads comprises four contact connection pads.

4. The leadframe of claim 1, further comprising:
at least one of a bond connection pad and a third die connection pad, which are arranged in a third plane at a bottom side of the at least one of the bond connection pad and the third die connection pad, which is situated between the first plane and the second plane and is parallel both to the first plane and to the second plane;
wherein the at least one of the bond connection pad and the third die connection pad is fabricated in one piece in each case with at least one of the multiplicity of contact connection pads.

5. The leadframe of claim 4,
wherein the bond connection pad is connected to the at least one second die connection pad via at least one metal web.

6. A semiconductor housing, comprising:
a first die connection pad, a second die connection pad and a multiplicity of contact connection pads;
a first die, which is secured at a top side of the first die connection pad: and
a moulding compound, which covers the first die and defines an outer surface of the semiconductor housing, wherein an underside of the first die connection pad and a top side of the second die connection pad form a part of the outer surface of the semiconductor housing;
wherein an underside of the multiplicity of contact connection pads and the underside of the first die connection pad form a mounting surface;
wherein a first number from the multiplicity of contact connection pads are applied on two opposite substantially linear sides of the first die connection pad and fabricated in one piece with the first die connection pad; and
wherein a second number from the multiplicity of contact connection pads are applied on two opposite substantially linear sides of the second die connection pad that are aligned with the two opposite substantially linear sides of the first die connection pad and fabricated in one piece with the second die connection pad.

7. The semiconductor housing of claim 6, further comprising:
a first bond connection pad, which is arranged in a third plane at a bottom side of the first bond connection pad, which is situated between a first plane defined by the first die connection pad and a second plane defined by the second die connection pad and is parallel both to the first plane and the second plane;
wherein the first bond connection pad is fabricated in one piece with at least one of the multiplicity of contact connection pads.

8. The semiconductor housing of claim 7, further comprising:
a metal clip secured at a top side of the first die and at a top side of the first bond connection pad;
wherein the first bond connection pad is connected to the second die connection pad via at least one metal web.

9. The semiconductor housing of claim 7, further comprising:
a second die secured at an underside of the second die connection pad.

10. The semiconductor housing of claim 9, further comprising:
a second bond connection pad, which is arranged in the third plane;
wherein the second die is electrically connected to the second bond connection pad; and
wherein the first die is electrically connected to the first bond connection pad.

11. The semiconductor housing of claim 9, further comprising:
a third die connection pad, which is arranged in the third plane; and
a third die secured at a top side of the third die connection pad;
wherein the third die is electrically connected to the first die.

12. A method for forming a semiconductor housing, the method comprising:
providing a leadframe, wherein the leadframe comprises a first die connection pad and a second die connection pad;
a multiplicity of contact connection pads, wherein an underside of the multiplicity of contact connection pads and an underside of the first die connection pad are arranged in a first plane;
wherein a top side of the second die connection pad is arranged in a second plane, which is arranged at a distance from the first plane that corresponds to the overall thickness of the semiconductor housing to be formed;
wherein a first number from the multiplicity of contact connection pads are applied on two opposite substantially linear sides of the first die connection pad and fabricated in one piece with the first die connection pad; and
wherein a second number from the multiplicity of contact connection pads are applied on two opposite substantially linear sides of the second die connection pad that are aligned with the two opposite substantially linear sides of the first die connection pad and fabricated in one piece with the second die connection pad;
securing a first die at a top side of the first die connection pad; and
moulding the semiconductor housing in a mould in order that the moulding compound forms an underside of the semiconductor housing in the first plane and forms a top side of the semiconductor housing in the second plane.

13. The method of claim 12, wherein providing a leadframe further comprises:
providing a first bond connection pad in the leadframe, said first bond connection pad being arranged in a third plane at a bottom side of the first bond connection pad, which is situated between the first plane and the second plane, wherein the first bond connection pad is parallel both to the first plane and to the second plane, wherein the first bond connection pad is fabricated in one piece with at least one of the multiplicity of contact connection pads; and
securing a metal clip at a top side of the first die and at a top side of the first bond connection pad, wherein the first bond connection pad is connected to the second die connection pad via at least one metal web.

14. The method of claim 12,
wherein providing a leadframe further comprises:
  providing a second bond connection pad, which is arranged in the third plane at a bottom side of the second bond connection pad;
wherein the method further comprises:
  securing a second die at an underside of the second die connection pad; and
  electrically connecting the second die to the second bond connection pad and the first die to the first bond connection pad.

15. The method of claim 12,
wherein providing a leadframe further comprises:
  providing a third die connection pad, which is arranged in the third plane at a bottom side of the third die connection pad;
wherein the method additionally comprises:
  securing a third die at a top side of the third die connection pad; and
  electrically connecting the first die to the third die.

\* \* \* \* \*